United States Patent [19]
Mazura

[11] Patent Number: 4,901,200
[45] Date of Patent: Feb. 13, 1990

[54] INSERTABLE HOUSING

[75] Inventor: Paul Mazura, Karlsbad/Spielberg, Fed. Rep. of Germany

[73] Assignee: Schroff GmbH, Straubenhardt, Fed. Rep. of Germany

[21] Appl. No.: 257,634

[22] Filed: Oct. 14, 1988

[30] Foreign Application Priority Data

Oct. 14, 1987 [EP] European Pat. Off. ........ 87 115000.9

[51] Int. Cl.⁴ ............................................. H05K 7/20
[52] U.S. Cl. .................................... 361/379; 361/384; 361/391; 361/383
[58] Field of Search ............... 361/384, 379, 381, 383, 361/390, 391

[56] References Cited

U.S. PATENT DOCUMENTS 4,774,631 9/1988 Okuyama et al. ................... 361/381

FOREIGN PATENT DOCUMENTS 0236501 9/1987 European Pat. Off. .
2211268 9/1973 Fed. Rep. of Germany .
3316978 11/1984 Fed. Rep. of Germany .
3408139 9/1985 Fed. Rep. of Germany ...... 361/383
3419688 11/1985 Fed. Rep. of Germany ...... 361/383

57-20458 2/1982 Japan ................................... 361/384

Primary Examiner—Roy N. Envall, Jr.
Attorney, Agent, or Firm—Spencer & Frank

[57] ABSTRACT

To remove the heat generated in cabinets in which inserts carrying components in the form of electrical instruments are arranged one above the other, it is necessary to provide for cooling by use of convection or fans. This requires space between the inserts which takes up usable space in the cabinet. The novel insertable housing is intended to reduce the space required for ventilation and eliminate the need for the prior art fan inserts and metal guide sheets. In standard prior art systems, at least two height units were required for each ventilation measure. In the novel insertable housing, its jacket is only one height unit higher than the component carrier 1. An air intake shaft is provided within the jacket below the component carrier and above the component carrier is provided an air discharge shaft, with the air intake shaft being followed by a front air intake opening provided in a frontal frame and the air discharge shaft being followed by an air discharge opening in the rear wall of the housing. The insertable housing, which is suitable as a table-model housing as well as for insertion, is used within a 19-inch modular system.

14 Claims, 2 Drawing Sheets

INSERTABLE HOUSING

BACKGROUND OF THE INVENTION

The present invention relates to an insertable housing for electrical and electronic devices for insertion into racks and cabinets of a modular system which is standardized at least with respect to its height units, the housing including a component carrier composed of profiled rails and side walls and a multi-part jacket having at least one air intake opening and at least one air discharge opening.

The proposed insertable housing may be used as an independent table model instrument and can be used, in particular, wherever it is to be integrated as a suitable insert in an instrument cabinet of the standard 19-inch modular system.

The heat generated by the electrical components disposed in the component carriers is removed by convection. For this purpose, the housings are provided with ventilation openings in the housing bottom and in the housing top. As long as such a housing is used as a table-model housing, the resulting air flow is generally enough to sufficiently cool the components. If this housing is now inserted into a cabinet or a rack in which further inserts are placed immediately above and below, the ventilation openings are covered and this interferes with convection to such an extent that a stream of cooling air must be generated with the aid of fans to flow through the components and provide for the necessary heat removal. Axial fans, transverse blowers and radial fans are known to produce the cooling air. These are installed—often several together—in separate ventilation inserts. These ventilation inserts take up quite a bit of room in the instrument cabinets. In standard systems their height is at least one height unit which is lost for other inserts. The same applies for air guide sheets in centrally ventilated instrument cabinets.

SUMMARY OF THE INVENTION

It is an object of the present invention to provide an insertable housing for electrical and electronic devices for insertion into cabinets of a standard modular system so that its space requirement is reduced and ventilation inserts are made unnecessary.

The solution of the problem at hand is based on an insertable housing including a component carrier composed of profiled rails and side walls and a multi-part jacket having at least one air intake opening and at least one air discharge opening. The problem is solved in that the jacket is higher by one height unit than the component carrier which has a height of a plurality of height units. In order to form a horizontal, lateral, upwardly open air intake shaft at the bottom of the housing, the component carrier is spaced from the jacket at the bottom and, in order to form a horizontal, lateral, downwardly open air discharge shaft at the top of the housing, the component carrier is spaced from the jacket at the top, with the bottom spacing and the top spacing together taking up one height unit. The jacket is provided with at least one air intake opening at its front connected to the air intake shaft and the air discharge opening is provided in the upper region of the rear wall of the housing and follows the air discharge shaft. This insertable housing requires only one height unit for ventilation and can be utilized, without special measures, as a table-model housing and as an insert in an instrument cabinet.

Advisably the lower spacing and the upper spacing each take up one half of a height unit. However, to improve flow conditions, the lower spacing may also be one third and the upper spacing two thirds of a height unit.

For the purpose of better air conduction, the component carrier may be provided with a rear wall which is fastened to the rear profile rails.

To rearwardly delimit the air intake shaft, a metal guide sheet is advisably provided in the shaft between the housing bottom of the jacket and the component carrier.

While the air intake shaft is advisably formed by the open housing bottom, the two side walls and the open underside of the component carrier, the air discharge shaft is formed by the top of the housing, the two side walls and the open upper side of the component carrier.

According to a further feature of the invention, the jacket has a rectangular frontal frame to which the component carrier is fastened. This frontal frame serves as a connecting member between the multi-part jacket and the component carrier and permits in a simple manner the fastening of handles or supporting angles.

Advantageously the air intake opening is disposed at the lower front edge of the frontal frame. This measure permits air to enter unimpededly into the air intake shaft eve if the housing is inserted in instrument cabinets.

The air intake opening may be formed by a number of parallel slots.

To enlarge the effective cross section of the slots, they may be made in a sloped section of the frontal frame.

It is of advantage for the side walls of the component carrier to be provided with rearward extensions and the component carrier to have two holding rails which are parallel to the profiled rails and which are fastened to the extensions.

One or more fans may be disposed between the holding rails.

According to a further feature of the invention, upper and lower side strips are shaped to the side walls of the component carrier so as to support various fastening devices.

Advisably, the frontal frame is fastened to the fastening devices.

BRIEF DESCRIPTION OF THE DRAWINGS

The invention will now be described in greater detail with reference to the attached drawings. These drawings show the following.

DESCRIPTION OF THE PREFERRED EMBODIMENT

Figure 1:
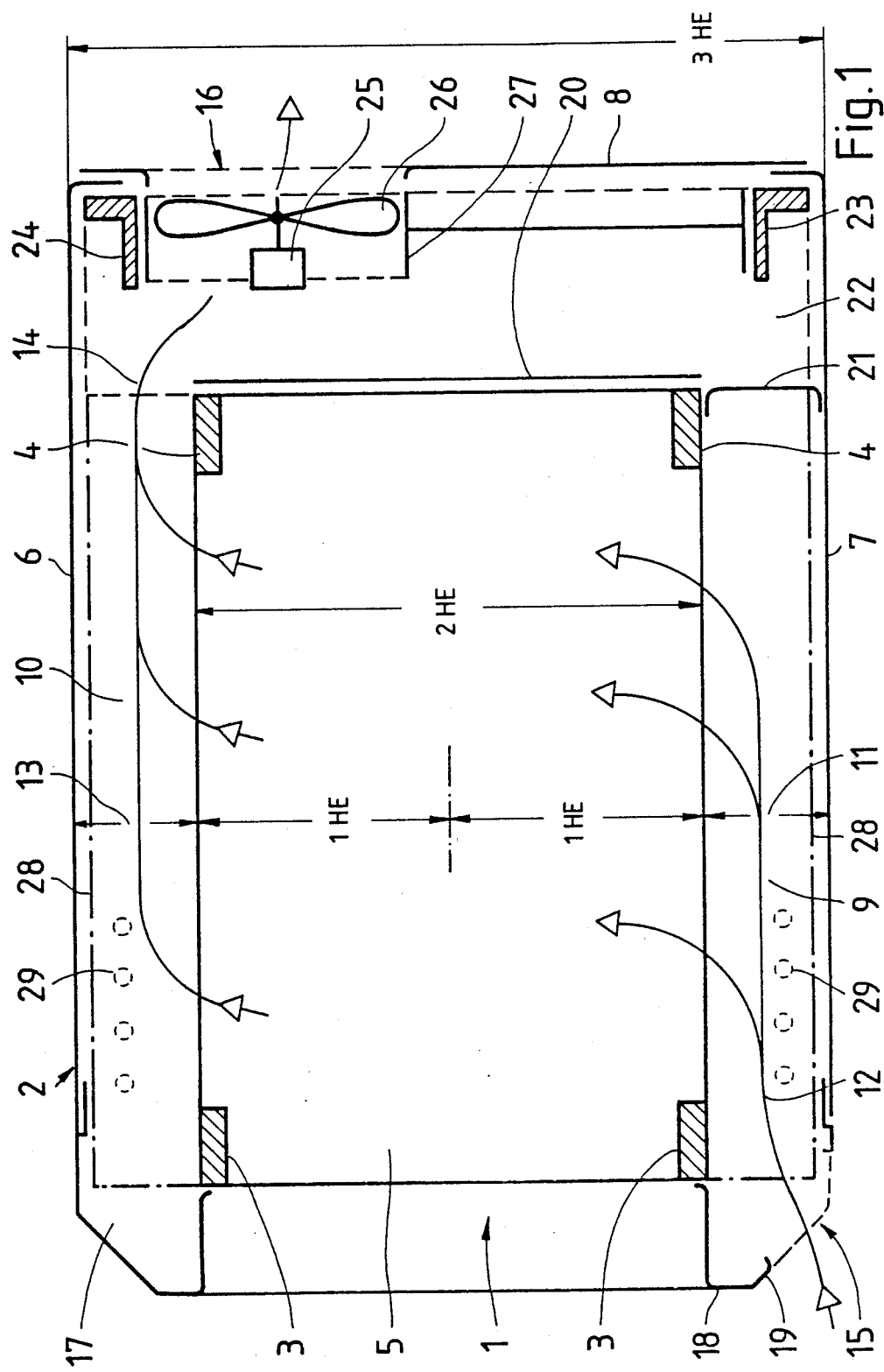
FIG. 1 is a simplified longitudinal sectional view of an insertable housing taking up three height units.

The insertable housing shown in a simplified version in FIG. 1 essentially includes a component carrier 1 and a jacket 2. This jacket 2 encloses component carrier 1.

The prism-shaped component carrier 1 is composed of two profiled front rails 3 and two profiled back rails 4 as well as two side walls 5. Profiled rails 3 and 4 are parallel to one another and the side walls are placed at a right angle to profiled rails 3 and 4. All parts of component carrier 1 and of jacket 2 are made of aluminum or steel sheet. Side walls 5 and profiled rails 3 and 4 are screwed to one another.

Jacket 2 is composed of several parts and includes a housing top 6, a housing bottom 7 and a rear housing wall 8.

The insertable housing intended for electronic and/or electrical devices is intended for insertion into cabinets or racks of a modular system which is standardized at least with respect to its height units HE. In the popular "19-inch modular system", such a height unit is a 44.45 millimeters. Component carrier 1 of the illustrated insertable housing takes up two height units HE and jacket 2 is higher by precisely one height unit HE, thus the latter has a height of 3 HE.

An air intake shaft 9 and an air discharge shaft 10 which serve to provide cooling for the components accommodated in component carrier 1 are provided between component carrier 1 and jacket 2.

To form the air intake shaft 9 disposed at housing bottom 7 and below component carrier 1, component carrier 1 is spaced a lower distance 11 from the jacket and from its housing bottom 7. On the top, this air intake shaft 9 is open on its side facing component carrier 1 so that the incoming air 12 (see the arrows) is able to flow from the bottom toward the component groups of component carrier 1. Correspondingly, component carrier 1 is spaced an upper distance 13 from jacket 2 and from its housing top 6, thus forming an air discharge shaft 10 which is open at the bottom on its side facing component carrier 1 to permit the exhaust air 14 to be removed (see the arrows). The lower distance 11 and the upper distance 12 are identical and are each one half height unit HE; both distances 11 and 12 together thus take up only one whole height unit HE.

Air intake shaft 9 is delimited by housing bottom 7, the two side walls 5 of component carrier 1 and by the open underside of component carrier 1, while air discharge air shaft 10 is delimited by the housing top, the two side walls 5 and the open upper side of component carrier 1.

Jacket 2 has a frontal air intake opening 15 followed by air intake shaft 9. An air discharge opening 16 following air discharge shaft 10 is provided in the upper region of rear housing wall 8 which is adjacent to housing top 6 and housing bottom 7.

Jacket 2 of the insertable housing includes a die-cast rectangular frontal frame 17 which is made of several parts and to which are fastened the two side walls 5 of component carrier 1. The air intake opening 15 in the form of a series of slots is disposed along the lower frontal edge 18 of frontal frame 17 in a sloped portion 19. Holding angles (not shown) can be screwed to the sides of frontal frame 17 for fastening the insertable housing in the instrument cabinet.

Component carrier 1 includes a rear wall 20 which may be formed, for example, by a bus plate. This rear wall 20 is screwed to the profiled back rails 4. The rear wall 20 terminates the rear side of component carrier 1 and serves to guide incoming air 12 through the components disposed in component carrier 1 upwardly in the direction toward housing top 6.

A guide sheet 21 is disposed in air intake shaft 9 between housing bottom 7 of jacket 2 and component carrier 1. This guide sheet 21 is screwed to the lower profiled back rail 4 and terminates air intake shaft 9 toward the rear.

Side walls 5 of component carrier 1 are provided with rectangular, rearward extensions 22 as shown by dashed lines in FIG. 1. These extensions 22 are made in one piece with side walls 5, are flush with them and extend to the rear housing wall 8 of jacket 2. Two holding rails 23 and 24 having an L-shaped profile are fastened to extensions 22 at a right angle and parallel to profiled rails 3 and 4, respectively.

Between the two holding rails 23 and 24 there is disposed a fan 26 driven by an electric motor 25 and placed in front of air discharge opening 16. The fan wheel revolves in a circular guide ring 27.

Upper and lower flat rectangular side strips 28 are shaped to side walls 5 of component carrier 1 in the same plane with it as shown by dot-dashed lines in FIG. 1. These side strips 28 are provided with fastening devices 29 in the form of a series of holes or the like to which frontal frame 17 is screwed.

Figure 2:
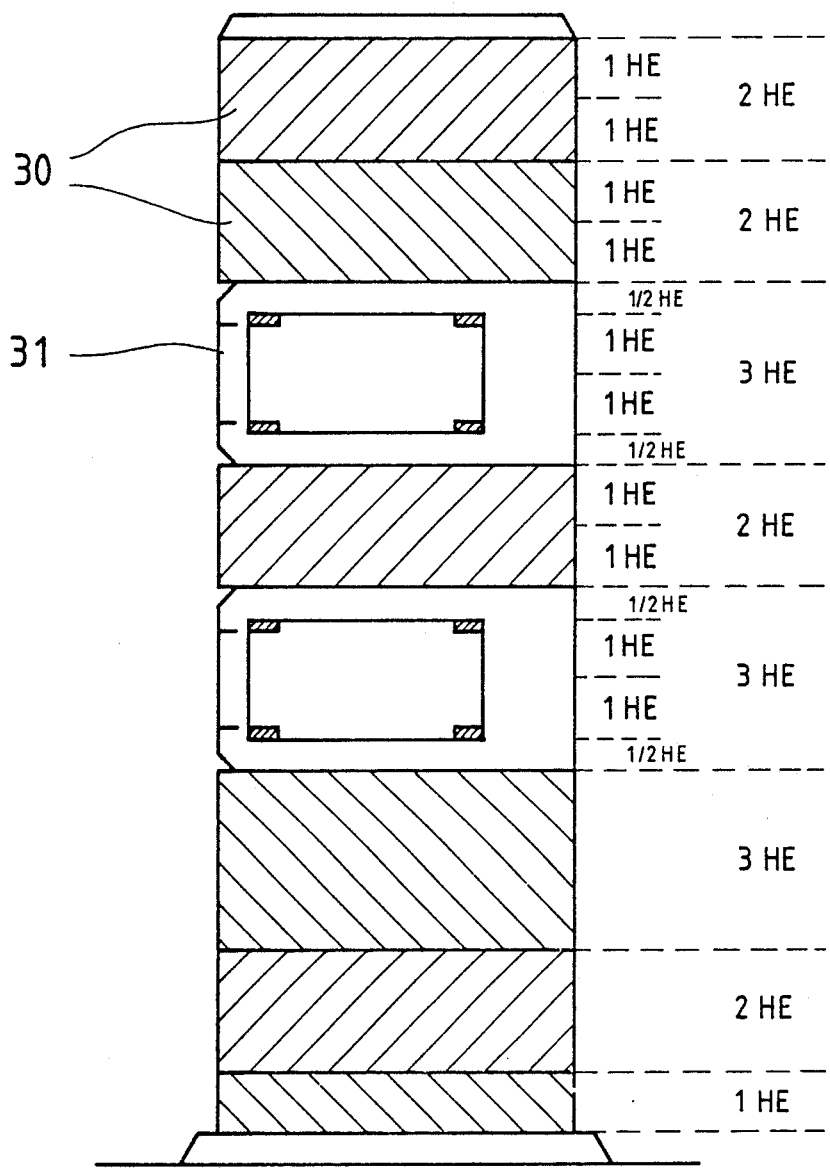
FIG. 2 is a schematic vertical sectional view of a cabinet in a modular system including various inserts and two insertable housings according to FIG. 1.

The instrument cabinet of a 19-inch modular system shown in a simplified manner in FIG. 2 accommodates, in addition to various inserts 30 carrying components and taking up between one and three height units HE, two insertable housings 31 which correspond to the housing shown in FIG. 1 and which take up three height units HE.

The present disclosure relates to the subject matter disclosed in European Patent Application 87/115,000.9 of Oct. 14, 1987, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. An insertable housing for electrical and electronic instruments for insertion in racks and cabinets of a modular system which is standarized at least with respect to its height units, comprising:

a component carrier having two side walls connected by upper and lower front supports and upper and lower back supports, said component carrier having an open upper side, an open underside, and a rear wall;

a jacket enclosing said component carrier and having a housing top and a housing bottom which are connected to said two side walls of said component carrier, said jacket including a frontal frame adjacent an end of said component carrier to form an entrance to said component container; said frontal frame having a frontal air intake opening; said housing bottom being spaced predetermined distance below said lower front rail and said lower back rail to define an air intake shaft; said housing top being spaced a predetermined distance above said upper front rail and said upper back rail to define an air discharge shaft; said housing top, said housing bottom, and said sidewalls of said jacket extending rearwardly beyond said rear wall of said component carrier to form an enclosure which is in communication with said air discharge shaft; said rear housing wall of said jacket having an air discharge opening; and fan means situated only at said rear housing wall of said jacket for exhausting air from said enclosure through said air discharge opening; whereby air is caused to flow in sequence from said frontal air intake opening in said frontal frame through said air intake shaft, through said component carrier in a horizontal direction, through said air discharge shaft, into said enclosure, and out of said jacket through said air discharge opening.

2. An insertable housing as defined in claim 1, wherein said component carrier encloses a volume having a height which is equal to two height units, and said air intake shaft and said air discharge shaft each have a height which is substantially equal to one half of a height unit.

3. An insertable housing as defined in claim 1, wherein said component carrier encloses a volume having a height which is equal to two height units, and said air intake shaft has a height which is substantially equal to one third of a height unit and said air discharge shaft has a height which is substantially equal to two thirds of a height unit.

4. An insertable housing as defined in claim 1, wherein said rear wall of said component carrier is fastened to said upper and lower back supports of said component carrier.

5. An insertable housing as defined in claim 1, wherein further comprising a metal guide sheet disposed in said air intake shaft between said housing bottom of said jacket and said component carrier.

6. An insertable housing as defined in claim 1, wherein said air intake shaft is bounded by said housing bottom, said two side walls and said open underside of said component carrier.

7. An insertable housing as defined in claim 1, wherein said air discharge shaft is bounded by said housing top, said two side walls and said open upper side of said component carrier.

8. An insertable housing as defined in claim 1, wherein said jacket is fastened to said component carrier.

9. An insertable housing as defined in claim 8, wherein said air intake opening is disposed at a lower frontal edge of said frontal frame.

10. An insertable housing as defined in claim 8, wherein said air intake opening includes a series of slots formed in a portion of said frontal frame.

11. An insertable housing as defined in claim 10, wherein portion of said frontal frame includes a sloped member in which said slots are disposed.

12. An insertable housing as defined in claim 1, wherein said component carrier includes two holding rails which are parallel with said upper and lower back supports and are fastened to portions of said sidewalls which extend rearwardly beyond said rear wall of said component carrier.

13. An insertable housing as defined in claim 1, further comprising upper and lower side strips are shaped to conform to said side walls of said component carrier to support fastening means.

14. An insertable housing as defined in claim 13, wherein said frontal frame is fastened adjacent said component carrier with said fastening means.

* * * * *